United States Patent
Lee et al.

(10) Patent No.: US 10,297,304 B1
(45) Date of Patent: May 21, 2019

(54) MEMORY DEVICE AND OPERATING METHOD THEREOF

(71) Applicant: NANYA TECHNOLOGY CORPORATION, New Taipei (TW)

(72) Inventors: Chung-Hsun Lee, New Taipei (TW); Hsien-Wen Liu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 73 days.

(21) Appl. No.: 15/810,122

(22) Filed: Nov. 12, 2017

(51) Int. Cl.
- *G11C 11/406* (2006.01)
- *G06F 11/07* (2006.01)
- *G11C 7/20* (2006.01)

(52) U.S. Cl.
CPC ........ *G11C 11/406* (2013.01); *G06F 11/0766* (2013.01); *G11C 11/40607* (2013.01); *G11C 7/20* (2013.01); *G11C 2211/4062* (2013.01); *G11C 2211/4067* (2013.01)

(58) Field of Classification Search
CPC ............ G11C 11/406; G11C 11/40607; G11C 29/42; G06F 11/1076; G06F 11/0766
See application file for complete search history.

(56) References Cited

U.S. PATENT DOCUMENTS

| | | | | |
|---|---|---|---|---|
| 2014/0181613 | A1* | 6/2014 | Klein | G11C 7/20 714/754 |
| 2015/0026537 | A1* | 1/2015 | Romanovskyy | G11C 11/406 714/764 |
| 2016/0034348 | A1* | 2/2016 | Park | G11C 29/42 714/764 |
| 2019/0006001 | A1* | 1/2019 | Chun | G11C 11/40607 |

* cited by examiner

*Primary Examiner* — Shelly A Chase
(74) *Attorney, Agent, or Firm* — CKC & Partners Co., LLC

(57) ABSTRACT

An operating method of a memory device includes the following operations: during a refresh operation with the first refresh rate, generating a first ECC according to first data, and generating a second ECC according to second data; determining whether an error exists in the first data or not during the refresh operation with a second refresh rate; determining whether the error exists in the second data or not during the refresh operation with a third refresh rate; and if it is determined that the error exists in the first data and/or the second data, correcting the first data and/or the second data. The second refresh rate and the third refresh rate are lower than the first refresh rate, and the third refresh rate is lower than the second refresh rate. The correcting ability of the second ECC is higher than the correcting ability of the first ECC.

17 Claims, 3 Drawing Sheets

MEMORY DEVICE AND OPERATING METHOD THEREOF

BACKGROUND

Technical Field

The present disclosure relates to memory technology. More particularly, the present disclosure relates to a memory device and an operating method thereof.

Description of Related Art

Memory device may operate in power saving mode. When memory device operates in power saving mode, power consumption is still difficult to be reduced because of refresh process.

SUMMARY

An aspect of the present disclosure is to provide an operating method of a memory device. The operating method includes the following operations: by the control circuit, during a refresh operation with the first refresh rate, controlling an error correction code (ECC) circuit to generate a first ECC according to first data, wherein the first data is stored in a first memory row of a memory array; by the control circuit, during a refresh operation with the first refresh rate, controlling the error correction code (ECC) circuit to generate a second ECC according to second data, wherein the second data is stored in a second memory row of the memory array; by the control circuit, controlling the ECC circuit to determine whether an error exists in the first data during the refresh operation with a second refresh rate; by the control circuit, controlling the ECC circuit to determine whether the error exists in the second data during the refresh operation with a third refresh rate; and by the control circuit, if it is determined that the error exists in the first data and/or the second data, controlling the ECC circuit to correct the first data and/or the second data. The second refresh rate and the third refresh rate are lower than the first refresh rate, and the third refresh rate is lower than the second refresh rate. The correcting ability of the second ECC is higher than a correcting ability of the first ECC.

Another aspect of the present disclosure is to provide a memory device. The memory device includes a memory array, an error correction code (ECC) circuit, a control circuit, and a storage unit. The memory array includes several first memory rows and several second memory rows, wherein the first memory rows store a plurality of first data and the second memory rows store a plurality of second data. The error correction code (ECC) circuit is coupled to the memory array. The control circuit is coupled to the memory array and the ECC circuit, wherein the control circuit is configured to control the ECC circuit to generate a first ECC according to the first data during refreshing the memory array by the first refresh rate, to generate a second ECC according to the second data during refreshing the memory array by the first refresh rate, to determine whether an error exists in the first data during the refresh operation with a second refresh rate, and to determine whether the error exists in the second data during the refresh operation with a third refresh rate. The storage unit is coupled to the ECC circuit. If it is determined that the error exists in the first data and/or the second data, the control circuit controls the ECC circuit to correct the first data and/or the second data. The second refresh rate and the third refresh rate are lower than the first refresh rate, and the third refresh rate is lower than the second refresh rate. The correcting ability of the second ECC is higher than the correcting ability of the first ECC.

In sum, the memory array of the memory device is partitioned into weak ECC protecting rows and strong ECC protecting rows, and the refresh rate of strong ECC protecting rows may be lower than the refresh rate of the weak ECC protecting rows, so that the power consumption of the memory device is effectively reduced. Furthermore, the control circuit controls the ECC circuit to determine whether an error exists in the data, and controls the ECC circuit to correct the data so that accuracy of the data is improved.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
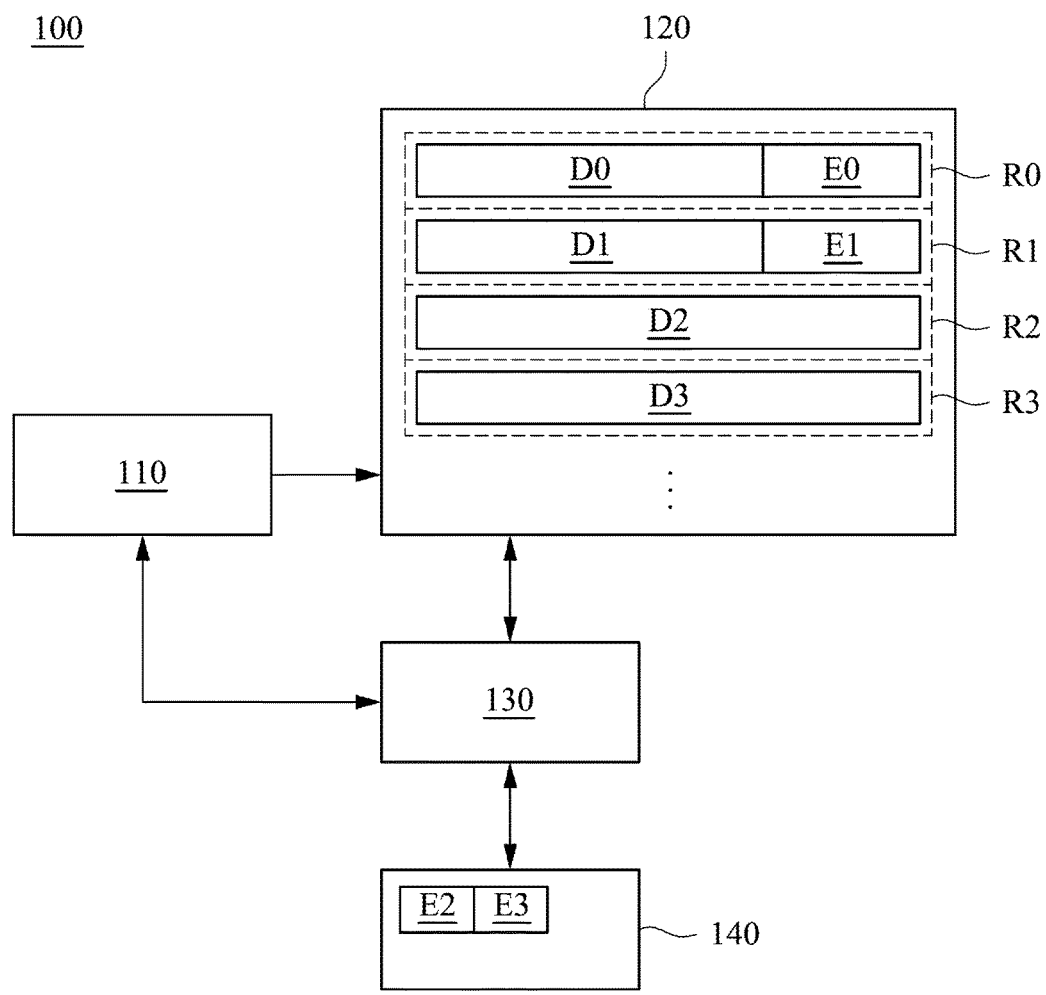
FIG. 1 is a schematic diagram of a memory device according to an embodiment of the present disclosure.

Reference is made to FIG. 1. FIG. 1 is a schematic diagram of a memory device 100 according to an embodiment of the present disclosure. The memory device 100 includes a memory array 120, an error correction code (ECC) circuit 130, a control circuit 110, and a storage unit 140. The ECC circuit 130 is coupled to the memory array 120. The control circuit 110 is coupled to the memory array 120 and the ECC circuit 130. The storage unit is coupled to the ECC circuit 130. As shown in FIG. 1, the memory array 120 includes several memory rows R0-R3, and the memory rows R0-R3 are configured to store plural of data D0-D3.

The memory rows R0 and R1 are weak ECC protecting rows, and the memory rows R2 and R3 are strong ECC protecting rows.

When the control circuit 110 receives data D0, the control circuit 110 is configured to control the ECC circuit 130 to generate ECC E0 according to the data D0 during refreshing the memory array 120 by the first refresh rate. When the control circuit 110 receives data D2, the control circuit 110 is configured to control the ECC circuit 130 to generate ECC E2 according to the data D2 during refreshing the memory array 120 by the first refresh rate. The data D0 are stored in the memory row R0, which is a weak ECC protecting row. The ECC E0 is stored in the memory array 120. In some embodiments, the ECC E0 and the data D0 are stored in the same row of the memory array 120. The data D2 are stored in the memory row R2, which is a strong ECC protecting row. The ECC E2 is stored in the storage unit 140.

Similarly, when the control circuit 110 receives data D1, the control circuit 110 is configured to control the ECC circuit 130 to generate ECC E1 according to the data D1 during refreshing the memory array 120 by the first refresh rate. When the control circuit 110 receives data D3, the control circuit 110 is configured to control the ECC circuit 130 to generate ECC E3 according to the data D3 during refreshing the memory array 120 by the first refresh rate. In some embodiments, the ECC E1 and the data D1 are stored in the same row of the memory array 120. The data D3 are stored in the memory row R2, which is a strong ECC protecting row. The ECC E3 is stored in the storage unit 140.

The correcting ability of the ECC of the data stored in the strong ECC protecting rows is higher than the correcting ability of the ECC of the data stored in the weak ECC protecting rows. That is, the ECC of the data stored in the strong ECC protecting rows can correct more error bits than the ECC of the data stored in the weak ECC protecting rows.

For example, data D0 is stored in the weak ECC protecting rows, and data D2 is stored in the strong ECC protecting rows. The correcting ability of the ECC E0, which is generated according to the data D0, is lower than the correcting ability of the ECC E2, which is generated according to the data D2. That is, the ECC E2 can correct more error bits than the ECC E0.

In some embodiments, the control circuit 110 is further configured to control the ECC circuit 130 to store the ECC of the data stored in the strong ECC protecting rows in the storage unit 140. In some embodiments, the control circuit 110 is further configured to control the ECC circuit 130 to store ECC of the data stored in the weak ECC protecting rows in the memory array.

For example, data D0-D1 are stored in the memory rows R0-R1, which are weak ECC protecting rows. Therefore, ECC E0-E1, which are generated from data D0-D1, are stored in the memory array 120. Data D2-D3 are stored in the memory rows R2-R3, which are strong ECC protecting rows. Therefore, ECC E2-E3, which are generated from data D2-D3, are stored in the storage unit 140.

The control circuit 110 is configured to control the ECC circuit 110 to determine whether an error exists in the data D0 or not during the refresh operation with a second refresh rate. In some embodiments, the control circuit 110 determines whether an error exists in the data D0 or not according to the data D0 and the ECC E0. That is, during the refresh operation with a second refresh rate, the ECC circuit 130 may read data D0 from the memory array 120 and ECC E0 from the memory array 120, and then, the ECC circuit 130 determines whether an error exists in the data D0 or not according to the data D0 and the ECC E0. If it is determined that the error exists in the data D0, the control circuit 110 controls the ECC circuit 130 to correct the data D0.

The control circuit 110 is configured to control the ECC circuit 110 to determine whether an error exists in the data D2 or not during the refresh operation with a third refresh rate. In some embodiments, the control circuit 110 determines whether an error exists in the data D2 or not according to the data D2 and the ECC E2. That is, during the refresh operation with a third refresh rate, the ECC circuit 130 may read data D2 from the memory array 120 and ECC E2 from the storage unit 140, and then, the ECC circuit 130 determines whether an error exists in the data D2 or not according to the data D2 and the ECC E2. If it is determined that the error exists in the data D2, the control circuit 110 controls the ECC circuit 130 to correct the data D2.

The ECC that are generated according to the data stored in the weak ECC protecting rows are stored in the memory array 120. The ECC that are generated according to the data stored in the strong ECC protecting rows are stored in the storage unit 140. For example, data D0 is stored in the weak ECC protecting row R0, and the ECC E0 generated according to data D0 is stored in the memory array 120. Data D2 is stored in the strong ECC protecting row R2, and the ECC E2 generated according to data D2 is stored in the memory unit 140.

In some embodiments, the second refresh rate and the third refresh rate are lower than the first refresh rate. That is, after generating the ECC and storing the data and the ECC into the memory array 120, the memory array 120 may be refreshed with a lower refresh rate.

In some embodiments, the third refresh rate is lower than the second refresh rate. Since the strong ECC protecting rows protect data with more bit, and the weak ECC protecting rows protect data with less bit, the strong ECC protecting rows allow more error bit than weak ECC protecting rows, the refresh rate of the strong ECC protecting rows may be lower than the refresh rate of the weak ECC protecting rows.

It should be noted that existence of the error indicates that the second refresh rate and/or the third refresh rate is too low to maintain accuracy of the data. In some embodiments, the control circuit 110 is further configured to increase the second refresh rate after the data D0 are corrected, and to increase the third refresh rate after the data D2 are corrected. For example, if the ECC circuit 130 determined that an error exists in the data D0, the control circuit 110 may increase the second refresh rate, which is the refresh rate of refreshing the weak ECC protecting rows. If the ECC circuit 130 determined that an error exists in the data D2, the control circuit 110 may increase the third refresh rate, which is the refresh rate of refreshing the strong ECC protecting rows. In some embodiments, even the second refresh rate and/or the third refresh rate are increased, the increased second refresh rate and/or the increased third refresh rate are lower than the first refresh rate.

In some embodiments, if the error exists in the data that are stored in the weak ECC protecting rows, the control circuit 110 is further configured to control the ECC circuit 130 to determine whether a number of a first error bit of the data is larger than a first threshold or not, and if the number of the first error bit is larger than the first threshold, the control circuit 110 is further configured to increase the second refresh rate.

For example, if the error exists in the data D0, the control circuit 110 determines whether the number of error bit of the data D0 is larger than a first threshold or not, and if the number of error bit of the data D0 is larger than a first threshold, control circuit 110 increases the second refresh rate.

In some embodiments, if the error exists in the data that are stored in the strong ECC protecting rows, the control circuit 110 is further configured to control the ECC circuit 130 to determine whether a number of an second error bit of the data is larger than a second threshold, and if the number of the second error bit is larger than the second threshold, the control circuit 110 is further configured to increase the third refresh rate.

For example, if the error exists in the data D2, the control circuit 110 determines whether the number of error bit of the data D2 is larger than a second threshold, and if the number of error bit of the data D2 is larger than a second threshold, control circuit 110 increases the third refresh rate.

In some embodiments, the storage unit 140 is configured to store an error table. For example, the control circuit 110 controls the ECC circuit 130 to record an address of the memory row R0 in the error table after the data D0 is corrected. As a result, addresses of memory rows that occurred errors of the data are recorded in the error table for identifying memory rows that are more likely to cause error bit.

In some embodiments, after the ECC circuit 130 corrected the data D0-D3, the control circuit 110 is further configured to control the ECC circuit 130 to write the corrected data back to the memory array 120. For example, if data D0 is corrected, the control circuit 110 controls the ECC circuit 130 to write the corrected data D0 back to the memory row R0. If data D2 is corrected, the control circuit 110 controls the ECC circuit 130 to write the corrected data D2 back to the memory row R2.

Figure 2:
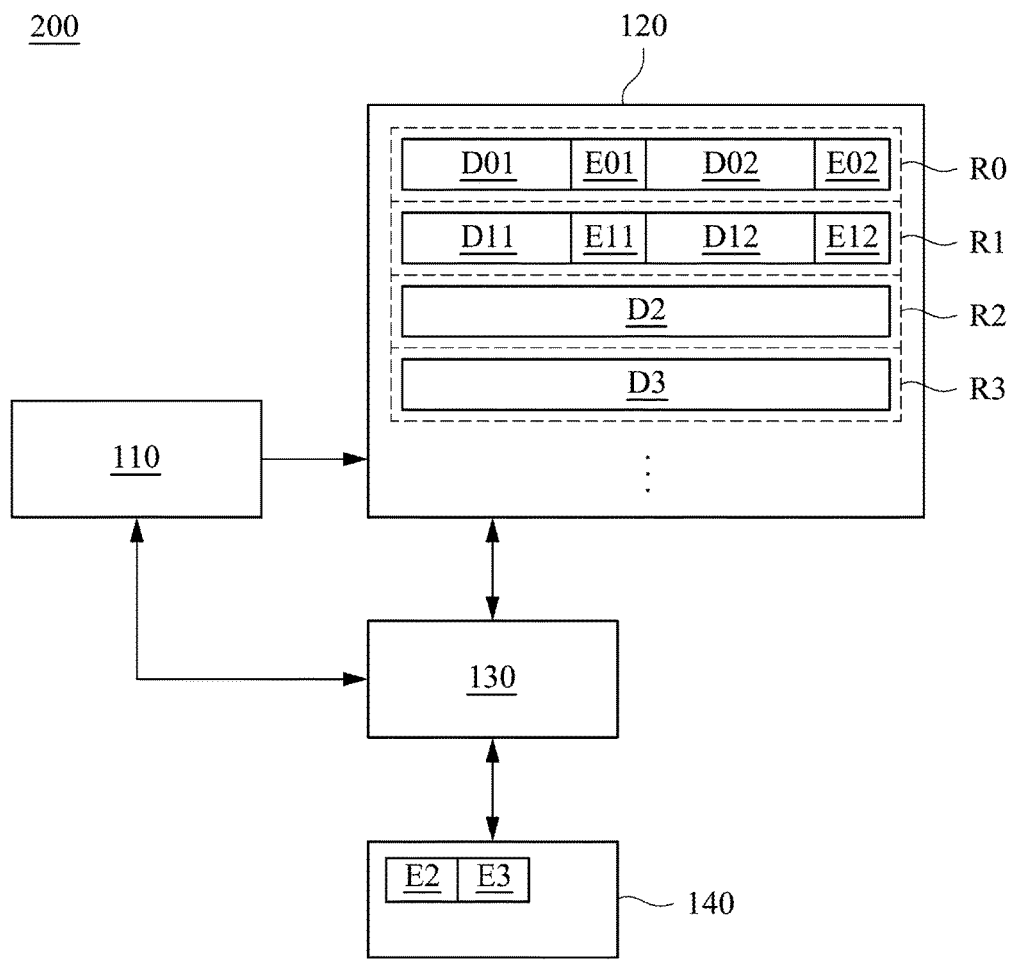
FIG. 2 is a schematic diagram of a memory device according to an embodiment of the present disclosure.

FIG. 2 is a schematic diagram of a memory device 200 according to an embodiment of the present disclosure. In some embodiments, the ECC of the data stored in the weak ECC protecting rows is generated according to a portion of the data. For example, reference is made to FIG. 2, data portion D01 is a first portion of the data D0, and ECC E01 is generated according to the data portion D01. Data portion D02 is a second portion of the data D0, and ECC E02 is generated according to the data portion D02. The data D01 and the ECC E01 are stored in the same row R0. The data D02 and the ECC E02 are stored in the same row R0.

Similarly, data portion D11 is a first portion of the data D1, and ECC E11 is generated according to the data portion D11. Data portion D12 is a second portion of the data D1, and ECC E12 is generated according to the data portion D12. The data D11 and the ECC E11 are stored in the same row R1. The data D12 and the ECC E12 are stored in the same row R1.

In some embodiments, for example, the control circuit 110 determines whether an error exists in the data D0 or not according to the data D01 and the ECC E01. That is, during the refresh operation with a second refresh rate, the ECC circuit 130 may read data D01 and the ECC E01 from the memory array 120, and then, the ECC circuit 130 determines whether an error exists in the data D0 or not according to the data D01 and the ECC E01. If it is determined that the error exists in the data D01, the control circuit 110 controls the ECC circuit 130 to correct the data D01.

Figure 3:
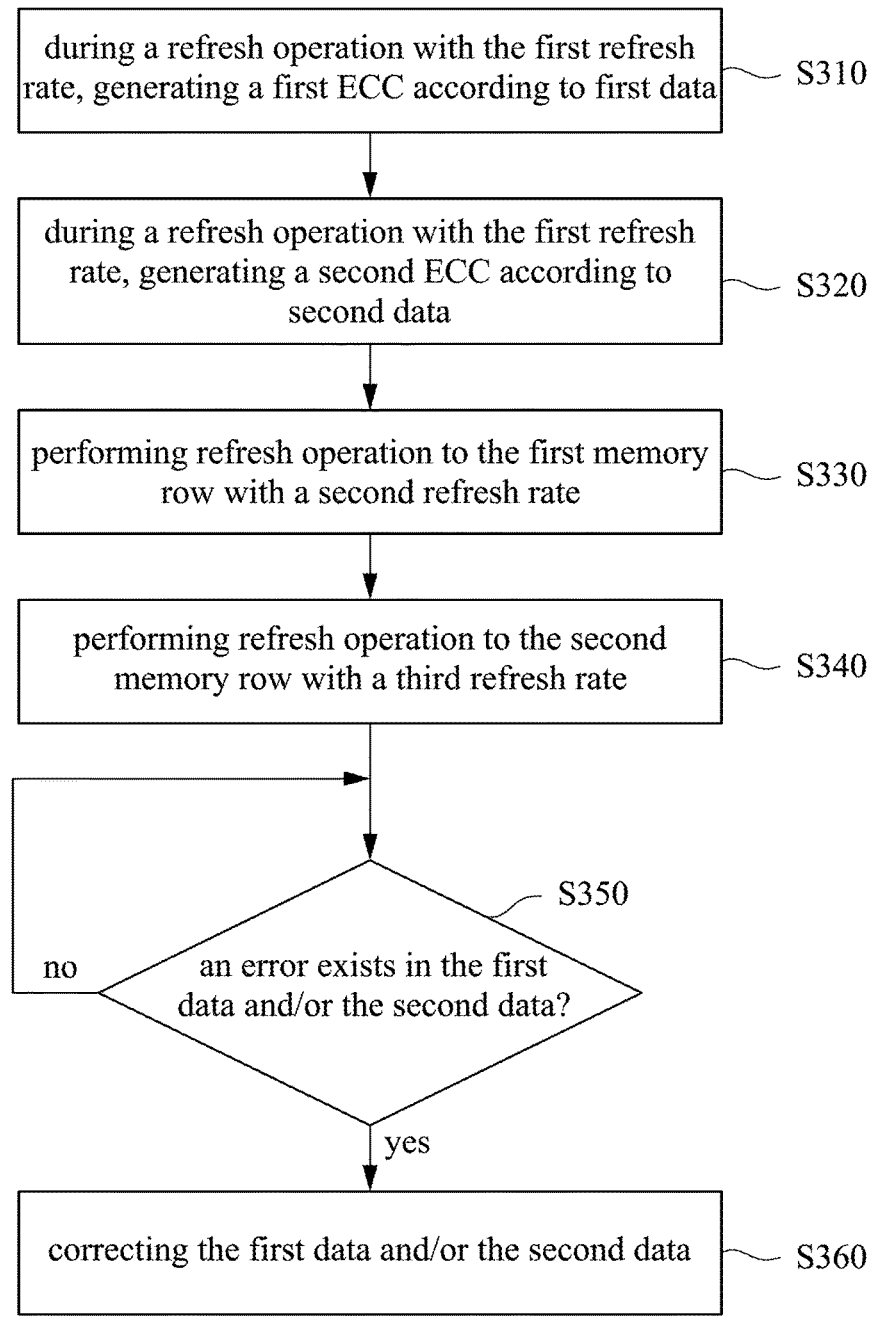
FIG. 3 is a schematic diagram of an operating method of a memory device in accordance with an embodiment of the present disclosure.

Reference is made to FIG. 3. FIG. 3 is an operating method 300 of a memory device 100/200 in accordance with an embodiment of the present disclosure. The operating method 300 includes the following operations:

S310: during a refresh operation with the first refresh rate, generating a first ECC according to first data, in which the first data is stored in a first memory row of a memory array, and the first ECC is stored in the memory array;

S320: during a refresh operation with the first refresh rate, generating a second ECC according to second data, in which the second data is stored in a second memory row of a memory array, and the second ECC is stored in a storage unit;

S330: performing refresh operation to the first memory row with a second refresh rate;

S340: performing refresh operation to the second memory row with a third refresh rate;

S350: determining whether an error exists in the first data and/or the second data or not; and S360: correcting the first data and/or the second data.

For convenience of explanation and understanding, reference is made to FIG. 1, FIG. 2, and FIG. 3. These operations are given for illustrative purposes. Additional operations are within the contemplated scoped of the present disclosure.

In operation S310, during a refresh operation with the first refresh rate, generating a first ECC according to first data, in which the first data is stored in a first memory row of a memory array, and the first ECC is stored in the memory array. In some embodiments, the control circuit 110 controls the ECC circuit 130 to perform operation S310. For example, during a refresh operation with the first refresh rate, the control circuit 110 controls the ECC circuit 130 to generate ECC E0 according to data D0. The control circuit 110 controls the ECC circuit 130 to store data D0 and ECC E0 in the memory row R0 of the memory array 120.

In operation S320, during a refresh operation with the first refresh rate, generating a second ECC according to second data, in which the second data is stored in a second memory row of a memory array, and the second ECC is stored in a storage unit. In some embodiments, the control circuit 110 controls the ECC circuit 130 to perform operation S320. For example, during a refresh operation with the first refresh rate, the control circuit 110 controls the ECC circuit 130 to generate ECC E2 according to data D2. The control circuit 110 controls the ECC circuit 130 to store data D2 in the memory row R2 of the memory array 120. The control circuit 110 controls the ECC circuit 130 to store ECC E2 in the storage unit 140.

The correcting ability of the second ECC is higher than the correcting ability of the first ECC, and the second ECC can correct more error bits than first ECC. That is, the correcting ability of the second ECC of the data stored in the strong ECC protecting rows is higher than the correcting ability of the first ECC of the data stored in the weak ECC protecting rows, and the second ECC of the data stored in the strong ECC protecting rows can correct more error bits than the first ECC of the data stored in the weak ECC protecting rows.

For example, data D0 is stored in the weak ECC protecting rows, and data D2 is stored in the strong ECC protecting rows. The correcting ability of the ECC E0, which is generated according to the data D0, is lower than the correcting ability of the ECC E2, which is generated according to the data D2. That is, the ECC E2 can correct more error bits than the ECC E0

In operation S330, performing refresh operation to the first memory row with a second refresh rate. In some embodiments, the control circuit 110 performs operation S330. For example, the control circuit 110 performs refresh operation to the memory row R0 and memory row R1, which are weak ECC protecting rows, with a second refresh rate. The second refresh rate is lower than the first refresh rate.

In operation S340, performing refresh operation to the second memory row with a third refresh rate. In some embodiments, the control circuit 110 performs operation S340. For example, the control circuit 110 performs refresh operation to the memory row R2 and memory row R3, which are strong ECC protecting rows, with a third refresh rate. The third refresh rate is lower than the second refresh rate.

In operation S350, determining whether an error exists in the first data and/or the second data or not. In some embodiments, the control circuit 110 controls the ECC circuit 130 to perform operation S350.

In some embodiments, the control circuit 110 controls the ECC circuit 130 to determine whether an error exists in the data D0-D1 during refreshing the memory array 120 by the second refresh rate. For example, as shown in FIG. 1, the control circuit 110 controls the ECC circuit 130 to read the data D0 and the ECC E0 from the memory row R0, and controls the ECC circuit 130 to determine whether an error exists in the data D0 during refreshing the memory array 120 by the second refresh rate. In some embodiments, as shown in FIG. 2, the control circuit 110 controls the ECC circuit 130 to read the data portion D01 of the data D0 and the ECC E01 from the memory row R0, and controls the ECC circuit 130 to determine whether an error exists in the data portion D01 of the data D0 during refreshing the memory array 120 by the second refresh rate.

In some embodiments, the control circuit 110 controls the ECC circuit 130 to determine whether an error exists in the data D2-D3 during refreshing the memory array 120 by the third refresh rate. For example, as shown in FIG. 1, the control circuit 110 controls the ECC circuit 130 to read the data D2 from the memory row R2 and the ECC E2 from the storage unit 140, and controls the ECC circuit 130 to determine whether an error exists in the data D2 during refreshing the memory array 120 by the third refresh rate.

If in operation S350, it is determined that an error exists in the first data and/or the second data, operation S360 is performed. If in operation S350, it is determined that an error does not exist in the first data and/or the second data, operation S350 is performed again.

In operation S360, correcting the first data and/or the second data. In some embodiments, the control circuit 110 controls the ECC circuit 130 to perform operation S360. For example, if the error exists is in the data D0, the control circuit 110 controls the ECC circuit 130 to correct the data D0. For example, if the error exists is in the data D2, the control circuit 110 controls the ECC circuit 130 to correct the data D2.

In contrast, if no error exists in the first data, the control circuit 110 controls the ECC circuit 130 to determine whether an error exists in the first data during refreshing the memory array 120 by the second refresh rate in operation S350. If no error exists in the second data, the control circuit 110 controls the ECC circuit 130 to determine whether an error exists in the second data during refreshing the memory array 120 by the third refresh rate in operation S350.

In some embodiments, operation S360 further includes: writing the corrected first data and the first ECC back to the memory array. For example, the control circuit 110 controls the ECC circuit 130 to write the corrected data D0 and the ECC E0 back to the memory row R0.

In some embodiments, operation S360 further includes: writing the corrected second data back to the memory array, and writing the second ECC back to the storage unit. For example, the control circuit 110 controls the ECC circuit 130 to write the corrected data D2 back to the memory row R2, and the control circuit 110 controls the ECC circuit 130 to write the ECC E2 back to the storage unit 140.

In some embodiments, the storage unit 140 stores an error table. In some embodiments, operation S360 further includes: recording an address of the memory row in the error table after the data is corrected. For example, the control circuit 110 controls the ECC circuit 130 to record an address of the memory row R0 in the error table after the data D0 is corrected. As a result, addresses of memory rows that occurred errors of the data are recorded in the error table for identifying weak memory rows.

In some embodiments, operation S360 further includes: increasing the second refresh rate if the first data is corrected, and increasing the third refresh rate if the second data is corrected. The increased second refresh rate and the increased third refresh rate are lower than the first refresh rate.

In some embodiments, operation S360 further includes: if the error exists in the first data (e.g., the data D0), the control circuit 110 controls the ECC circuit 130 to determine whether a number of the first error bit is larger than a first threshold (may be determined according to actual demand). If the number of the first error bit is larger than the first threshold, the control circuit 110 increases the second refresh rate after the first data (e.g., the data D0) is corrected.

In some embodiments, operation S360 further includes: if the error exists in the second data (e.g., the data D02), the control circuit 110 controls the ECC circuit 130 to determine whether a number of the second error bit is larger than a second threshold (may be determined according to actual demand). If the number of the second error bit is larger than the second threshold, the control circuit 110 increases the third refresh rate after the second data (e.g., the data D2) is corrected.

As a result, with the threshold for the number of the error bit, power consumption of the memory device 100 (or 200) is reduced and accuracy of the data D0-D3 is flexibly adjusted when the memory device 100 (or 200) is operated in power saving mode with the refresh rate that is smaller than the first refresh rate.

In sum, the control circuit 110 reduces the first refresh rate to the second refresh rate and/or the third refresh rate so that power consumption of the memory device 100/200 is effectively reduced. Furthermore, the memory array 120 of the memory device 100/200 is partitioned into weak ECC protecting rows and strong ECC protecting rows, and the refresh rate of strong ECC protecting rows may be lower than the refresh rate of the weak ECC protecting rows, that is, the third refresh rate is lower than the second refresh rate, the second refresh rate is lower than the first refresh rate, so that the power consumption of the memory device is effectively reduced.

Moreover, the control circuit 110 controls the ECC circuit 130 to determine whether an error exists in the data D0-D3 or not during refreshing the memory array 120 by the second refresh rate, and controls the ECC circuit 130 to correct the data so that accuracy of the data D0-D3 is improved.

The memory device 100/200 mentioned above are for illustrative purposes only, and the present disclosure is not limited thereto.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An operating method of a memory device, comprising:
by a control circuit, during a refresh operation with the first refresh rate, controlling an error correction code (ECC) circuit to generate a first ECC according to first data, wherein the first data is stored in a first memory row of a memory array;
by the control circuit, during a refresh operation with the first refresh rate, controlling the error correction code (ECC) circuit to generate a second ECC according to second data, wherein the second data is stored in a second memory row of the memory array;
by the control circuit, controlling the ECC circuit to determine whether an error exists in the first data or not during the refresh operation with a second refresh rate;
by the control circuit, controlling the ECC circuit to determine whether the error exists in the second data or not during the refresh operation with a third refresh rate; and
by the control circuit, if it is determined that the error exists in the first data and/or the second data, controlling the ECC circuit to correct the first data and/or the second data;
wherein the second refresh rate and the third refresh rate are lower than the first refresh rate, and the third refresh rate is lower than the second refresh rate;
wherein a correcting ability of the second ECC is higher than a correcting ability of the first ECC.

2. The operating method of claim 1, wherein the first ECC is stored in the memory array, and the second ECC is stored in a storage unit.

3. The operating method of claim 1, further comprising:
by the control circuit, increasing the second refresh rate after the first data is corrected; and
by the control circuit, increasing the third refresh rate after the second data is corrected.

4. The operating method of claim 1, further comprising:
by the control circuit, if the error exists in the first data, determining whether a number of a first error bit is larger than a first threshold or not;
by the control circuit, if the number of the first error bit is larger than the first threshold, increasing the second refresh rate after the first data is corrected;
by the control circuit, if the error exists in the second data, determining whether a number of a second error bit is larger than a second threshold or not; and
by the control circuit, if the number of the second error bit is larger than the second threshold, increasing the third refresh rate after the second data is corrected.

5. The operating method of claim 1, further comprising:
by the control circuit, controlling the ECC circuit to record an address of the first memory row in an error table after the first data is corrected; and
by the control circuit, controlling the ECC circuit to record an address of the second memory row in the error table after the second data is corrected;
wherein the error table is stored in the storage unit.

6. The operating method of claim 1, further comprising:
by the control circuit, controlling the ECC circuit to write a corrected first data back to the first memory row; and
by the control circuit, controlling the ECC circuit to write a corrected second data back to the second memory row.

7. The operating method of claim 1, wherein the first ECC is generated according to a first portion of the first data.

8. The operating method of claim 1, further comprising:
by the control circuit, controlling the ECC circuit to store the second ECC in the storage unit; and
by the control circuit, controlling the ECC circuit to store the first ECC in the memory array.

9. A memory device, comprising:
a memory array, comprising a plurality of first memory rows and a plurality of second memory rows, wherein the first memory rows store a plurality of first data and the second memory rows store a plurality of second data;
an error correction code (ECC) circuit, coupled to the memory array;
a control circuit, coupled to the memory array and the ECC circuit, wherein the control circuit is configured to control the ECC circuit to generate a first ECC according to the first data during refreshing the memory array by the first refresh rate, to generate a second ECC according to the second data during refreshing the memory array by the first refresh rate, to determine whether an error exists in the first data or not during the refresh operation with a second refresh rate, and to determine whether the error exists in the second data or not during the refresh operation with a third refresh rate; and
a storage unit, coupled to the ECC circuit;
wherein if it is determined that the error exists in the first data and/or the second data, the control circuit controls the ECC circuit to correct the first data and/or the second data;
wherein the second refresh rate and the third refresh rate are lower than the first refresh rate, and the third refresh rate is lower than the second refresh rate;
wherein a correcting ability of the second ECC is higher than a correcting ability of the first ECC.

10. The memory device of claim 9, wherein first ECC is stored in the memory array, and the second ECC is stored in a stored in the storage unit.

11. The memory device of claim 9, wherein the control circuit is further configured to increase the second refresh rate after the first data is corrected, and to increase the third refresh rate after the second data is corrected.

12. The memory device of claim 9, wherein if the error exists in the first data, the control circuit is further configured to control the ECC circuit to determine whether a number of a first error bit is larger than a first threshold or not, and
if the number of the first error bit is larger than the first threshold, the control circuit is further configured to increase the second refresh rate.

13. The memory device of claim 9, wherein if the error exists in the second data, the control circuit is further configured to control the ECC circuit to determine whether a number of an second error bit is larger than a second threshold or not, and if the number of the second error bit is larger than the second threshold, the control circuit is further configured to increase the third refresh rate.

14. The memory device of claim 9, further comprising:

a storage unit, coupled to the ECC circuit and configured to store an error table, wherein the control circuit is further configured to control the ECC circuit to record an address of the first memory row in the error table after the first data is corrected, and to record an address of the second memory row in the error table after the second data is corrected.

15. The memory device of claim 9, wherein the control circuit is further configured to control the ECC circuit to write a corrected first data back to the first memory row, and to write a corrected second data back to the second memory row.

16. The memory device of claim 9, wherein the first ECC is generated according to a first portion of the first data.

17. The memory device of claim 9, wherein the control circuit is further configured to control the ECC circuit to store the second ECC in the storage unit and to store the first ECC in the memory array.

\* \* \* \* \*